(12) United States Patent
Choi

(10) Patent No.: US 9,871,061 B2
(45) Date of Patent: Jan. 16, 2018

(54) DISPLAY SUBSTRATE AND METHOD OF FABRICATING THE SAME

(71) Applicant: Samsung Display Co., Ltd., Yongin (KR)

(72) Inventor: Young-Joo Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 36 days.

(21) Appl. No.: 14/731,272

(22) Filed: Jun. 4, 2015

(65) Prior Publication Data

US 2016/0064420 A1 Mar. 3, 2016

(30) Foreign Application Priority Data

Aug. 27, 2014 (KR) .................. 10-2014-0112348

(51) Int. Cl.
*H01L 27/12* (2006.01)

(52) U.S. Cl.
CPC .................. *H01L 27/124* (2013.01)

(58) Field of Classification Search
CPC ...... G02F 1/134309; G09G 2300/0876; H01L 27/1218
See application file for complete search history.

(56) References Cited

U.S. PATENT DOCUMENTS

| 6,414,730 | B1 | 7/2002 | Aksmatsu |
| 7,872,722 | B2 | 1/2011 | Kimura |
| 2008/0136990 | A1* | 6/2008 | Kimura ............... H01L 27/1218 349/46 |
| 2011/0024758 | A1* | 2/2011 | Kimura ............. G02F 1/134363 257/59 |
| 2011/0050551 | A1* | 3/2011 | Ota ................... G02F 1/134363 345/87 |
| 2011/0310341 | A1 | 12/2011 | Kim et al. |
| 2013/0119392 | A1 | 5/2013 | Park et al. |
| 2015/0235585 | A1 | 8/2015 | Kim et al. |
| 2016/0062198 | A1 | 3/2016 | Wang et al. |
| 2016/0064412 | A1 | 3/2016 | Choi |
| 2016/0064414 | A1 | 3/2016 | Choi |
| 2016/0064420 | A1 | 3/2016 | Choi |

FOREIGN PATENT DOCUMENTS

| KR | 10-2000-0029304 | 5/2000 |
| KR | 10-2003-0058237 | 7/2003 |
| KR | 10-2011-0040167 | 4/2011 |
| KR | 10-2012-0125823 | 11/2012 |

OTHER PUBLICATIONS

Final Office Action dated Oct. 7, 2016 in U.S. Appl. No. 14/725,993.

(Continued)

*Primary Examiner* — Thomas L Dickey

(74) *Attorney, Agent, or Firm* — H.C. Park & Associates, PLC

(57) ABSTRACT

A display substrate and its fabricating method have been disclosed. In a horizontal-field-mode liquid crystal display device, while maintaining five mask processes, additional direct contact has been formed to implement a narrow bezel.

12 Claims, 3 Drawing Sheets

(56) References Cited

OTHER PUBLICATIONS

Non-Final Office Action dated Feb. 1, 2016 in U.S. Appl. No. 14/753,867.
Final Office Action dated Jun. 13, 2016 in U.S. Appl. No. 14/753,867.
Non-Final Office Action dated Apr. 8, 2016 in U.S. Appl. No. 14/725,993.
Notice of Allowance dated Oct. 3, 2016 in U.S. Appl. No. 14/753,867.
Notice of Allowance dated Jan. 20, 2017 in U.S. Appl. No. 14/753,867.
Notice of Allowance dated Mar. 6, 2017, in U.S. Appl. No. 14/725,993.

* cited by examiner

DISPLAY SUBSTRATE AND METHOD OF FABRICATING THE SAME

CROSS-REFERENCE TO RELATED APPLICATION

This application claims priority from and the benefit of Korean Patent Application No. 10-2014-0112348, filed on Aug. 27, 2014, which is hereby incorporated by reference for all purposes as if fully set forth herein.

BACKGROUND

Field

Exemplary embodiments relate to a display substrate, and a method of fabricating the same. More particularly, exemplary embodiments relate to a display substrate, and a method of fabricating the same, which implements a narrow bezel by additionally forming a direct contact part (D-CNT) while maintaining five mask (M) processes utilized for fabricating the display substrate used in a liquid crystal display device in a horizontal field, also known as Plane to Line Switching (PLS), mode as they are.

Discussion of the Background

In general, a liquid crystal display device includes a display substrate including a switching element and a pixel electrode, an opposing substrate opposite to the display substrate, and a liquid crystal layer interposed between the display substrate and the opposing substrate. The liquid crystal display device displays an image in a method of applying a voltage to the liquid crystal layer and controlling transmittance of light.

The liquid crystal display device may be divided into a vertical field mode liquid crystal display device and a horizontal field mode liquid crystal display device according to a direction of the electric field.

Recently, the liquid crystal display device operating in the vertical field mode shows a wide viewing angle problem, which results in active development of the horizontal-field-mode liquid crystal display. Particularly, researchers try to reduce manufacturing cost of a liquid crystal display device operated in a Plane to Line Switching (PLS) mode, which is an example of the horizontal field mode.

The display substrate includes a plurality of thin film patterns formed by patterning a thin film formed on an insulating substrate through a photolithography process. Each of the thin film patterns may be formed by forming a photoresist pattern on the thin film, and etching the thin film by using the photoresist pattern as an etching preventing film. The photolithography process may be performed by dry etching or wet etching according to a property of the thin film. When the thin film includes metal, the thin film may generally be patterned by using an etchant composition, and when the thin film is an insulating layer including a silicon oxide and the like, the thin film may generally be patterned by using etching gas.

In general, one mask is required to form one thin film pattern. However, recently, in order to minimize use of a high-priced mask or simplify a process, one mask may form two or more thin film patterns. Although one mask is used, the different thin films require different etching process depending on the thin film properties. So it is impossible to substantially reduce the process steps.

In this respect, the present application discloses a method for forming a direct contact part (D-CNT) pattern. This can achieve a narrow bezel, while keeping five (5) mask processes.

The above information disclosed in this Background section is only for enhancement of understanding of the background of the inventive concept, and, therefore, it may contain information that does not form the prior art that is already known in this country to a person of ordinary skill in the art.

SUMMARY OF THE INVENTION

Exemplary embodiments provide a display substrate, having a direct contact part (D-CNT) to implement a narrow bezel, formed using the existing five (5) mask processes.

Additional aspects will be set forth in the detailed description which follows, and, in part, will be apparent from the disclosure, or may be learned by practice of the inventive concept.

An exemplary embodiment of the present invention provides a display substrate, including: a lower common electrode formed on a substrate; an insulating layer formed on the lower common electrode; a gate pattern including a gate electrode formed on the insulating layer, and a common electrode contact part and a direct contact part spaced apart from the gate electrode; a gate insulating layer formed on the substrate including the gate pattern; a semiconductor layer disposed on the gate insulating layer; a pixel part spaced apart from the semiconductor layer; source and drain electrodes disposed on the gate insulating layer including the semiconductor layer, a first conductive layer connected with the common electrode contact part spaced apart from the source and drain electrodes, a second conductive layer connected with the direct contact part spaced apart from the source and drain electrodes; and a passivation layer formed on the source and drain electrodes and the conductive layers.

The lower common electrode may be entirely deposited on the substrate, and may not be patterned.

The lower common electrode and the pixel unit may comprise TCO (transparent conductive oxide)-based material.

The insulating layer and the gate insulating layer may comprise an Si-based insulating layer.

The gate electrode may comprise metal selected from the group consisting of copper, aluminum, molybdenum, tungsten, titanium, and chrome in a single form or an alloy form.

The source/drain electrodes may include a lower barrier of TCO (transparent conductive oxide) material and a metal layer on the barrier, and the metal layer may be copper and the barrier may be ITO or IZO.

Another exemplary embodiment of the present invention provides a method of fabricating a display substrate, including: entirely depositing a lower common electrode on a substrate; depositing an insulating layer on the lower common electrode; depositing and firstly patterning gate metal on the insulating layer to form gate pattern including a gate electrode, a common electrode contact part, and a direct contact part; forming a gate insulating layer on a substrate including the gate pattern; depositing and secondly patterning a semiconductor material on the gate insulating layer to form a semiconductor layer; thirdly patterning a region of the gate insulating layer, and forming a first contact hole and a second contact hole at the common electrode contact part and the direct contact part, respectively; depositing and fourthly patterning source/drain metal up to on a pixel part, and forming a source and drain electrode, a first conductive layer on the first contact hole and a second conductive layer on the second contact hole; and depositing and fifthly patterning a passivation layer to open the pixel part.

The gate pattern may be patterned by wet etching, and the insulating layer from the gate electrode to the lower common electrode may be patterned by dry etching.

The first contact hole and the second contact hole are more preferably patterned by dry etching.

The source/drain metal comprises a lower barrier of TCO material and a metal layer on the lower barrier, and only the metal layer deposited up to on the pixel part is etched by wet etching so that the lower barrier is left when the pixel part is opened. The metal layer may be made of copper.

The common electrode contact part may be in side contact with the lower common electrode with pixel metal when the passivation layer is patterned.

According to the exemplary embodiments of the present invention, it is possible to form the direct contact part (D-CNT) by using the same photo mask as the existing photo mask, thereby implementing a narrow bezel.

Further, a semiconductor layer is separately patterned, so that an HT mask is not required when source/drain electrodes are patterned.

Further, it is possible to form the pixel part in a lump by using a Cu/TCO material deposited up to on the pixel part when the source/drain electrodes are patterned.

Further, the common electrode is entirely deposited, thereby decreasing a defect caused by static electricity.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE INVENTION

Figure 1:
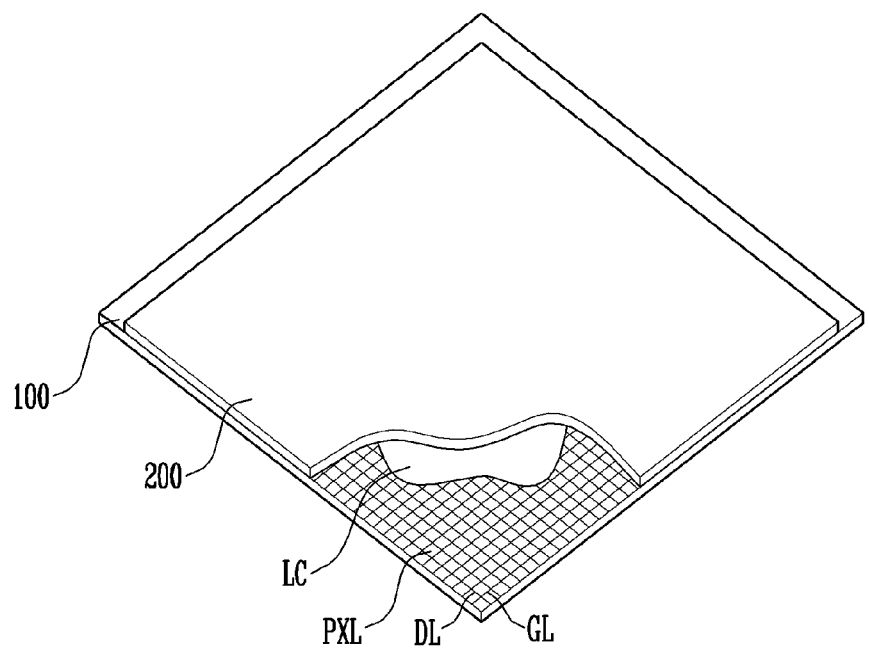
FIG. 1 is an exploded perspective view illustrating a display device including a display substrate according to a first exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is an exploded perspective view illustrating a display device including a display substrate according to a first exemplary embodiment of the present invention.

Referring to FIG. 1, the display device includes a display substrate 100 including a plurality of pixels PXL, an opposing substrate 200 opposite to the display substrate 100, and a liquid crystal layer LC disposed between the display substrate 100 and the opposing substrate 200. Data lines DL and gate lines GL are also disposed on the display substrate 100.

Each pixel of the display substrate 100 includes at least one thin film transistor, a pixel electrode, and a common electrode for driving liquid crystal molecules. The opposing substrate 200 may include color filters for expressing colors of an image.

The liquid crystal layer LC includes a plurality of liquid crystal molecules having dielectric anisotropy. When an electric field is applied between the pixel electrode and the common electrode of the display substrate 100, the liquid crystal molecules of the liquid crystal layer LC rotates in a specific direction between the display substrate 100 and the opposing substrate 200, and thus adjusting the transmittance of light incident to the liquid crystal layer LC.

Figure 2:
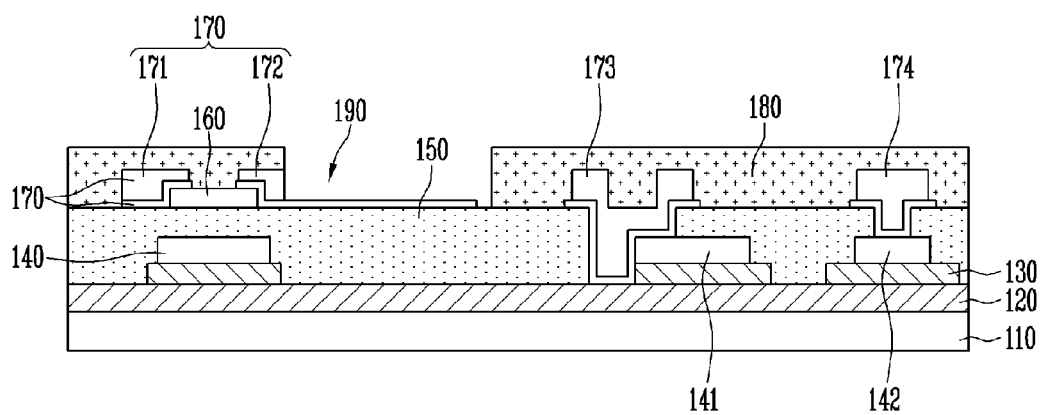
FIG. 2 is a cross-sectional view of the display substrate according to the first exemplary embodiment of the present invention.

FIG. 2 is a cross-sectional view of the display substrate according to the first exemplary embodiment of the present invention. FIGS. 3A to 3F are schematic diagrams illustrating a process of fabricating the display substrate according to the first exemplary embodiment of the present invention.

Referring to FIG. 2, the display substrate 100 includes an insulating substrate 110 having a plurality of pixel areas, a common electrode 120, a gate electrode 140, a source and drain electrode 170, and a plurality of pixels. Here, each of the pixels has the same structure, so that, for convenience of the description, FIG. 2 illustrates one pixel PXL 190 among the pixels, and one common electrode 120, one gate electrode 140, and a source and drain electrode 170 adjacent to the pixel 190.

Figure 3A:
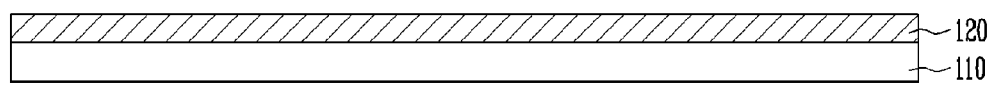
FIGS. 3A to 3G are schematic diagrams illustrating a method of fabricating the display substrate according to the first exemplary embodiment of the present invention.

Referring to FIGS. 2 and 3A, the substrate 110 may be formed of a transparent insulating material. A plurality of pixel areas may be disposed on the substrate 110 in a matrix form.

A lower common electrode 120 is disposed on the substrate 110. The lower common electrode 120 is entirely disposed on the substrate 110, and is not patterned. The common electrode 120 is deposited on the entire surface of substrate 110, thereby expecting the same effect as that of metal deposition on a rear surface, that is, an effect of decreasing static electricity according to a decrease in a potential difference between the gate line and the data line.

A TCO-based material, for example, Indium Zinc Oxide (IZO) and Indium Tin Oxide (ITO), may be used in the lower common electrode 120, and the lower common electrode 120 may be formed in a regular thickness by a general method in this field, for example, sputtering or Chemical Vapor Deposition (CVD).

Figure 3B:
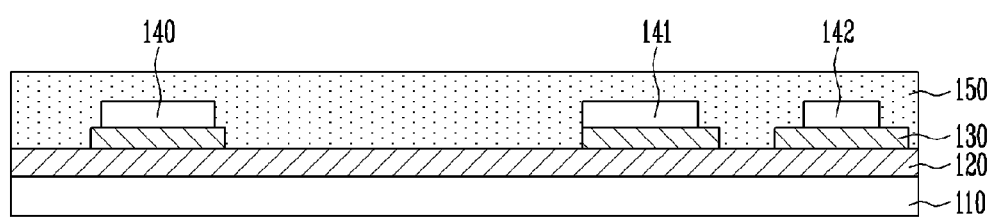

As illustrated in FIG. 3B, an insulating layer 130 is disposed on the lower common electrode 120. Here, an Si-based material, for example, SiNx, SiOx, or SiONx, may be used as insulating layer, and the insulating layer may be formed in a regular thickness by a general method in this field, for example, sputtering or CVD.

The insulating layer 130 isolates the lower common electrode 120 and the gate electrode 140.

A gate pattern including the gate line GL and the gate electrode 140 is disposed on the insulating layer 130. Further, a common electrode contact part (com-CNT) 141 and a direct contact part (D-CNT) 142 are disposed together on the same layer while being spaced apart from the gate electrode 140.

The gate pattern including the gate line GL of FIG. 1 and the gate electrode 140 is formed of a gate forming material, and the common electrode contact part 141 and the direct contact part (D-CNT) 142 disposed on the same layer together with the gate pattern are also formed of the same material.

The insulating layer 130 formed on the lower common electrode 120 is patterned when the gate electrode 140 is patterned, and also, the common electrode contact part 141 and the direct contact part (D-CNT) 142 disposed on the same layer as that of the gate electrode 140 may be simultaneously formed. The direct contact part 142 may implement a narrow bezel.

In this case, the common electrode contact part 141 and the direct contact part 142 disposed on the same layer may be formed together with the gate electrode by using photoresist exposed through a first mask (not illustrated). The gate pattern may be patterned by a general method in this field, for example, dry etching and wet etching, but more preferably, the gate pattern may be patterned by wet etching, and the insulating layer from the gate electrode 140 to the lower common electrode 120 may be patterned by dry etching.

The insulating layer 130 between the gate electrode 140 and the lower common electrode 120 exists only in an area where the gate pattern is formed, and in this case, the insulating layer 130 has a structure protruding to the outside of the gate pattern.

Metal, such as copper, aluminum, molybdenum, tungsten, and chrome, may be used in forming the gate line GL, the gate electrode 140, the common electrode contact part 141, and the direct contact part 142, and Mo, Ti, or an Mo/Ti alloy may be used at an upper/lower side of the metal, and may be formed in a single layer, a multilayer, or an alloy layer, for example, a molybdenum-aluminum-molybdenum (Mo—Al—Mo) triple layer or a molybdenum-aluminum alloy layer.

The gate insulating layer 150 is formed on the substrate on which the gate electrode 140 is formed, and the gate insulating layer 150 covers the gate electrode 140, the gate line GL, the common electrode contact part 142, and the direct contact part 142. They are insulated from another conductive thin film, which is formed later, by the gate insulating layer 150.

Figure 3C:
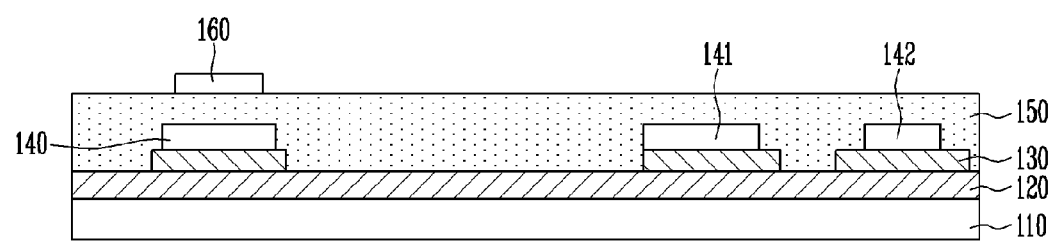

Then, as illustrated in FIG. 3C, a semiconductor layer 160 is formed by depositing a semiconductor thin film on the gate insulating layer 150 and patterning the semiconductor thin film. In this case, semiconductor layer 160 is formed by patterning the semiconductor thin film by using photoresist exposed through a second mask (not illustrated). Similarly, the semiconductor thin film may be patterned by a general method in this field, for example, dry etching or wet etching.

Similarly, an Si-based material, for example, SiNx, SiOx, or SiONx, may be used as the gate insulating layer 150, and the gate insulating layer 150 may be formed in a regular thickness by a general method in this field, for example, sputtering or CVD.

A general semiconductor layer in this field may be used as the semiconductor layer 160, and for example, amorphous silicon (n+ a-Si) doped with n+ at a high concentration and the like may be used, so that the semiconductor layer 160 may be formed in a regular thickness.

Figure 3D:
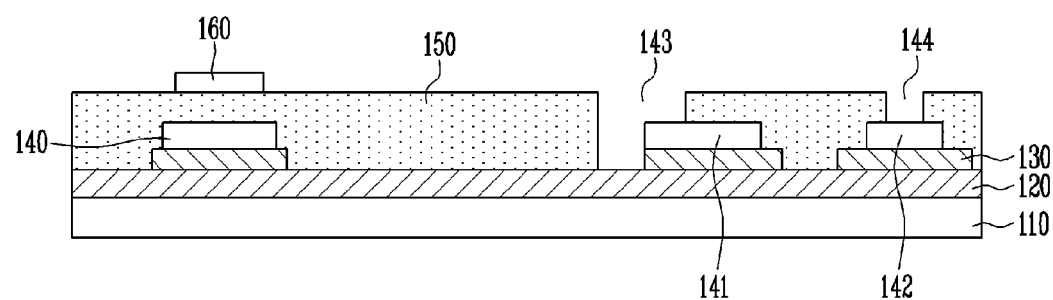

As illustrated in FIG. 3D, a first contact hole 143 and a second contact hole 144 are formed in the common electrode contact part 141 and the direct contact part 142 respectively by patterning a region of the gate insulating layer 150 on which the semiconductor layer 160 is not disposed. The common electrode contact part 141 and the direct contact part 142 may be seen through the first contact hole 143 and the second contact hole 144 respectively. In this case, the first contact hole 143 and the second contact hole 144 are formed by patterning the region of the gate insulating layer 150 by using photoresist exposed through a third mask (not illustrated). The first contact hole 143 and the second contact hole 144 are more preferably patterned by dry etching.

Figure 3E:
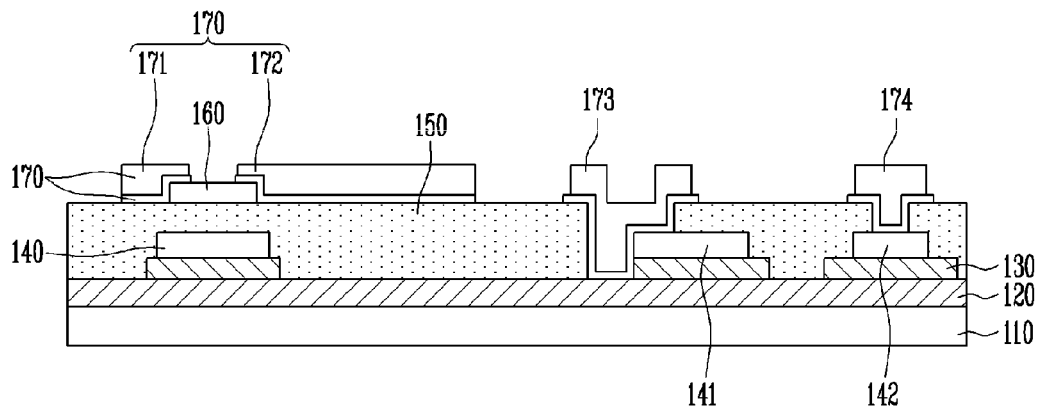

As illustrated in FIG. 3E, a source and drain electrode 170 is disposed on the semiconductor layer 160.

Next, source/drain metal is deposited and patterned up to the pixel part, as well as source and drain electrode regions to form the source and drain electrode 170.

The source/drain electrodes may include a lower barrier of TCO material and a metal layer on the barrier, and the metal layer may be copper and the barrier may be ITO or IZO.

A source electrode 171 is branched from the data line DL. In plane, the source electrode 171 overlaps a part of the semiconductor layer 160. A drain electrode 172 is spaced apart from the source electrode 171, and overlaps the remaining part of the semiconductor layer 160.

The display substrate 100 may further include a first conductive layer 173 and a second conductive layer 174 extended from the drain electrode 172. The conductive layers 173 and 174 may be spaced apart from the source and drain electrodes 171 and 172, and disposed on the same layer. The conductive layers 173 and 174 may be made of the same material as the source and drain electrodes 171 and 172. The first conductive layer 173 is electrically connected with the lower common electrode 120 through the first contact hole 143, and further, the common electrode contact part 141 is in side contact with the lower common electrode 120, and the second conductive layer 174 is electrically connected with the direct contact part 142 through the second contact hole 144. The conductive layers 173 and 174 are formed together with the source and drain electrodes.

In this case, the conductive layers 173 and 174 are formed together with the source and drain electrodes 171 and 172 by patterning using a fourth mask (not illustrated).

Figure 3F:
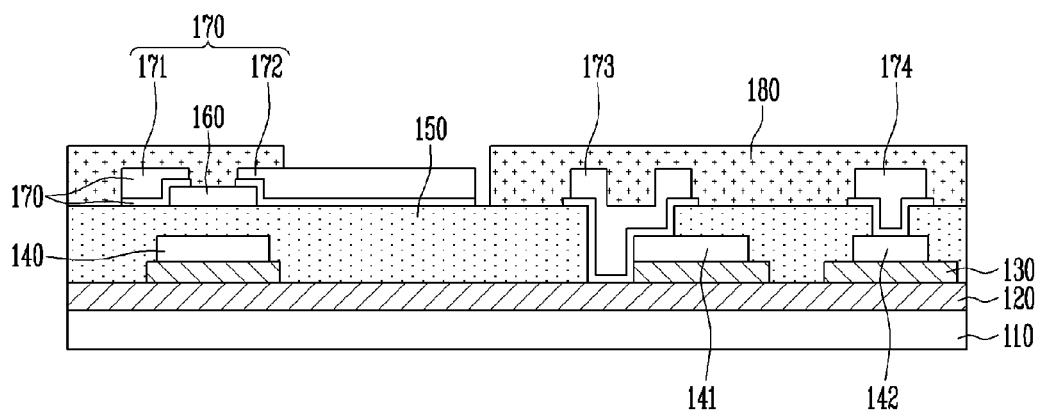

As illustrated in FIG. 3F, the display substrate 100 may further include a passivation layer 180 on the source and drain electrodes 170 and the conductive layers 173 and 174. The passivation layer 180 may be formed of an organic insulating material or an inorganic insulating material. The passivation layer 180 is patterned to open the pixel part 190.

In this case, the passivation layer 180 is formed by patterning using a fifth mask (not illustrated).

Figure 3G:
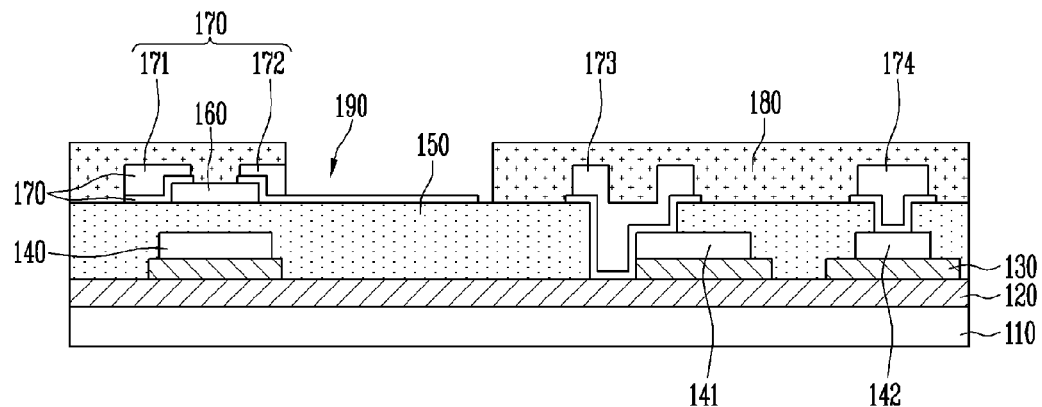

As illustrated in FIG. 3G, the lower barrier of TCO material is left by etching the metal layer such as copper through wet etching to form the TCO-based pixel part 190.

The method of fabricating the display substrate used in a liquid crystal display device in a horizontal field mode (PLS) according to the present invention implements a narrow bezel by additionally forming the direct contact part (D-CNT) while maintaining the utilized five mask processes as they are.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display substrate, comprising:
a common electrode disposed on a substrate;
an insulating layer disposed on the common electrode;
a gate electrode disposed on the insulating layer;
a common electrode contact part and a direct contact part disposed on the insulating layer and spaced apart from the gate electrode;
a gate insulating layer disposed on the substrate;
a semiconductor layer disposed on the gate insulating layer;
a pixel part spaced apart from the semiconductor layer;
source and drain electrodes disposed on the gate insulating layer and the semiconductor layer, the source and drain electrodes comprising a first lower barrier and a first metal layer disposed on the first lower barrier;
a first conductive layer coupled with a side of the common electrode contact part and an upper surface of the common electrode, the first conductive layer comprising a second lower barrier and a second metal layer disposed on the second lower barrier;
a second conductive layer coupled with and disposed on the direct contact part, the second conducive layer comprising a third lower barrier and a third metal layer disposed on the third lower barrier; and
a passivation layer formed on the source and drain electrodes, the first conductive layer, and the second conductive layer,
wherein the second lower barrier and the third lower barrier comprise a same material as the first lower barrier of the source and drain electrodes,
wherein the second metal layer and the third metal layer comprise a same material as the first metal layer of the source and drain electrodes,
wherein the pixel part comprises the same material as the first lower barrier of the drain electrode and extends from the drain electrode; and
wherein the second lower barrier makes contact with the common electrode contact part and the third lower barrier makes contact with the direct contact part.

2. The display substrate of claim 1, wherein the common electrode is entirely deposited on the substrate, and is not patterned.

3. The display substrate of claim 1, wherein the common electrode and the pixel part comprise a transparent conductive oxide (TCO)-based material.

4. The display substrate of claim 1, wherein the insulating layer and the gate insulating layer comprise a Si-based insulating layer.

5. The display substrate of claim 1, wherein the gate electrode comprises a metal selected from the group consisting of copper, aluminum, molybdenum, tungsten, titanium, and chrome either as a single element or as an alloy.

6. The display substrate of claim 5, wherein the gate electrode comprises multiple layers.

7. The display substrate of claim 1, wherein the first, second, and third lower barriers comprise a transparent conductive oxide (TCO)-based material.

8. The display substrate of claim 7, wherein the first, second, and third metal layer comprise copper and the first, second, and third lower barriers comprise a TCO-based material selected from the group consisting of indium tin oxide (ITO) and indium zinc oxide (IZO).

9. The display substrate of claim 1, wherein the common electrode contact part and the direct contact part are formed of a same material.

10. The display substrate of claim 9, wherein the common electrode contact part and the direct contact part are formed simultaneously.

11. The display substrate of claim 1, wherein a bottom surface of the common electrode contact part and a bottom surface of the direct contact part directly disposed on the insulating layer.

12. The display substrate of claim 1, wherein the common electrode contact part is formed simultaneously with the gate electrode and disposed on the insulating layer.

* * * * *